United States Patent
Lo et al.

(10) Patent No.: US 10,665,727 B2
(45) Date of Patent: May 26, 2020

(54) SEMICONDUCTOR STRUCTURE AND MANUFACTURING METHOD OF THE SAME

(71) Applicant: TAIWAN SEMICONDUCTOR MANUFACTURING COMPANY LTD., Hsinchu (TW)

(72) Inventors: Wen-Shun Lo, Hsinchu County (TW); Felix Ying-Kit Tsui, Cupertino, CA (US)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 3 days.

(21) Appl. No.: 16/034,825

(22) Filed: Jul. 13, 2018

(65) Prior Publication Data

US 2020/0020813 A1  Jan. 16, 2020

(51) Int. Cl.
*H01L 29/872* (2006.01)
*H01L 21/265* (2006.01)
*H01L 21/266* (2006.01)
*H01L 27/06* (2006.01)
*H01L 29/08* (2006.01)
*H01L 29/06* (2006.01)
*H01L 29/66* (2006.01)
*H01L 29/78* (2006.01)

(52) U.S. Cl.
CPC .......... *H01L 29/872* (2013.01); *H01L 21/266* (2013.01); *H01L 21/26513* (2013.01); *H01L 29/0607* (2013.01); *H01L 29/08* (2013.01); *H01L 29/66143* (2013.01); *H01L 27/0629* (2013.01); *H01L 29/7833* (2013.01)

(58) Field of Classification Search
CPC .......................... H01L 29/872; H01L 21/26513
USPC ....................................................... 257/475
See application file for complete search history.

(56) References Cited

U.S. PATENT DOCUMENTS

| | | | |
|---|---|---|---|
| 7,893,442 B2* | 2/2011 | Shim | H01L 29/872 257/481 |
| 10,157,980 B1* | 12/2018 | Lo | H01L 21/426 |
| 2006/0157748 A1* | 7/2006 | Chong | H01L 29/66136 257/288 |
| 2007/0001193 A1* | 1/2007 | Drobny | H01L 27/0629 257/107 |
| 2007/0278608 A1* | 12/2007 | Shim | H01L 29/417 257/481 |
| 2017/0309611 A1* | 10/2017 | Liu | H01L 27/0255 |

* cited by examiner

*Primary Examiner* — Igwe U Anya
(74) *Attorney, Agent, or Firm* — WPAT, P.C., Intellectual Property Attorneys; Anthony King

(57) ABSTRACT

Present disclosure provides a semiconductor structure, including a semiconductor substrate having a top surface, a first well region of a first conductivity type in the semiconductor substrate, a second well region of a second conductivity type in the semiconductor substrate, laterally surrounding the first well region, and an isolation region in the first well region and the second well region in proximity to the top surface. The first well region includes a first lighter doped region in proximity to the top surface, and a heavier doped region under the first lighter doped region. Present disclosure also provides a method for manufacturing the semiconductor structure described herein.

20 Claims, 10 Drawing Sheets

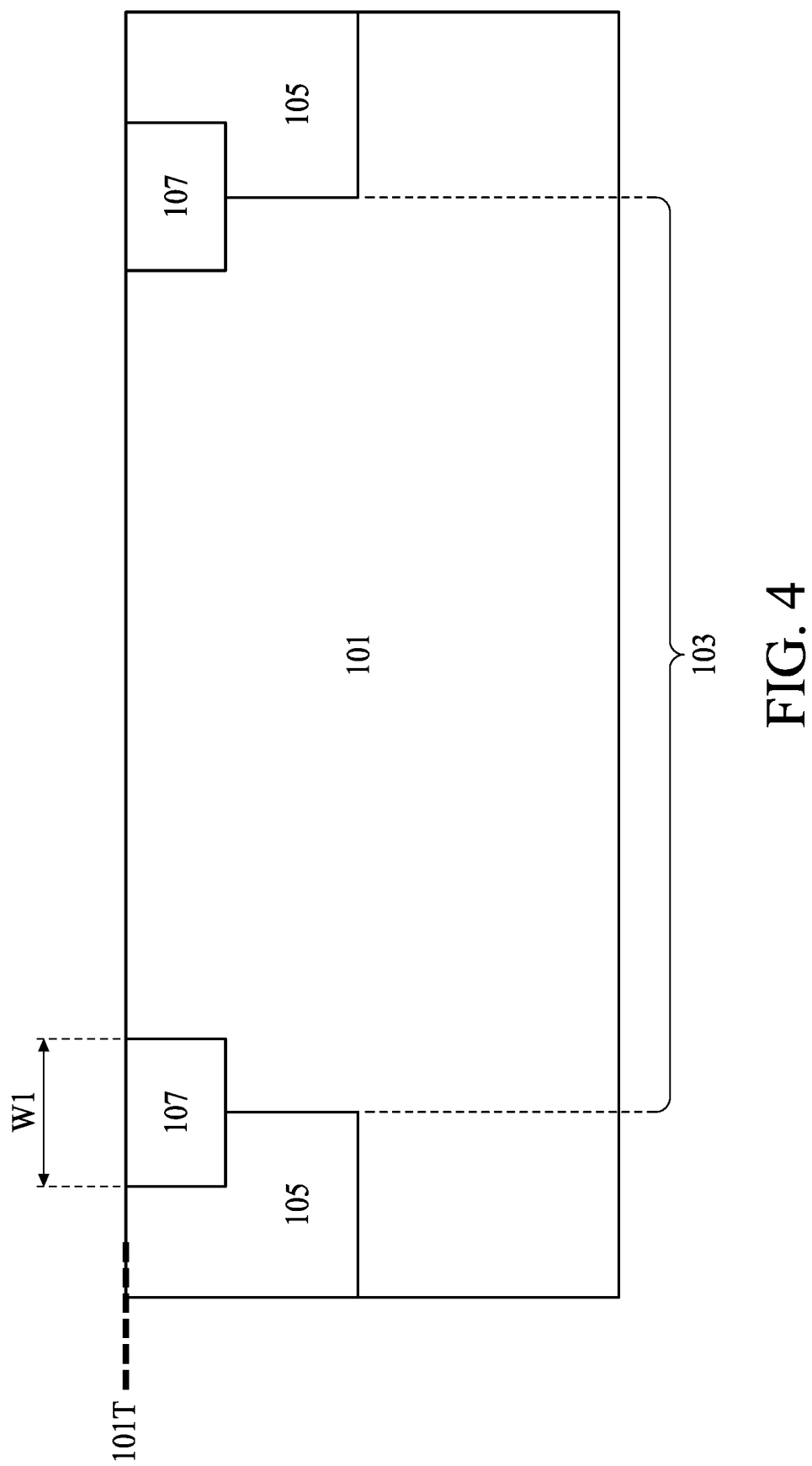

SEMICONDUCTOR STRUCTURE AND MANUFACTURING METHOD OF THE SAME

BACKGROUND

Integrated circuit (IC) technologies are constantly being improved. Such improvements frequently involve scaling down device geometries to achieve lower fabrication costs, higher device integration density, higher speeds, and better performance. Along with the advantages from geometry size reductions, improvements to IC devices are being made. One such IC device is a Schottky barrier diode. The Schottky barrier diode comprises a metal in contact with the surface of a semiconductor material. Schottky barrier diodes exhibit very low forward voltage drop, switching speeds that approach zero time, and are particularly useful in radio-frequency or even mille meter wave applications. However, conventional Schottky barrier diodes exhibit higher than desirable junction capacitance and parasitic resistance.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

FIG. 4 is a cross sectional view of a semiconductor structure in a Schottky Barrier Diode (SBD) region during an intermediate stage of its manufacturing process, according to some embodiments of present disclosure.

DETAILED DESCRIPTION OF THE DISCLOSURE

Figure 1:
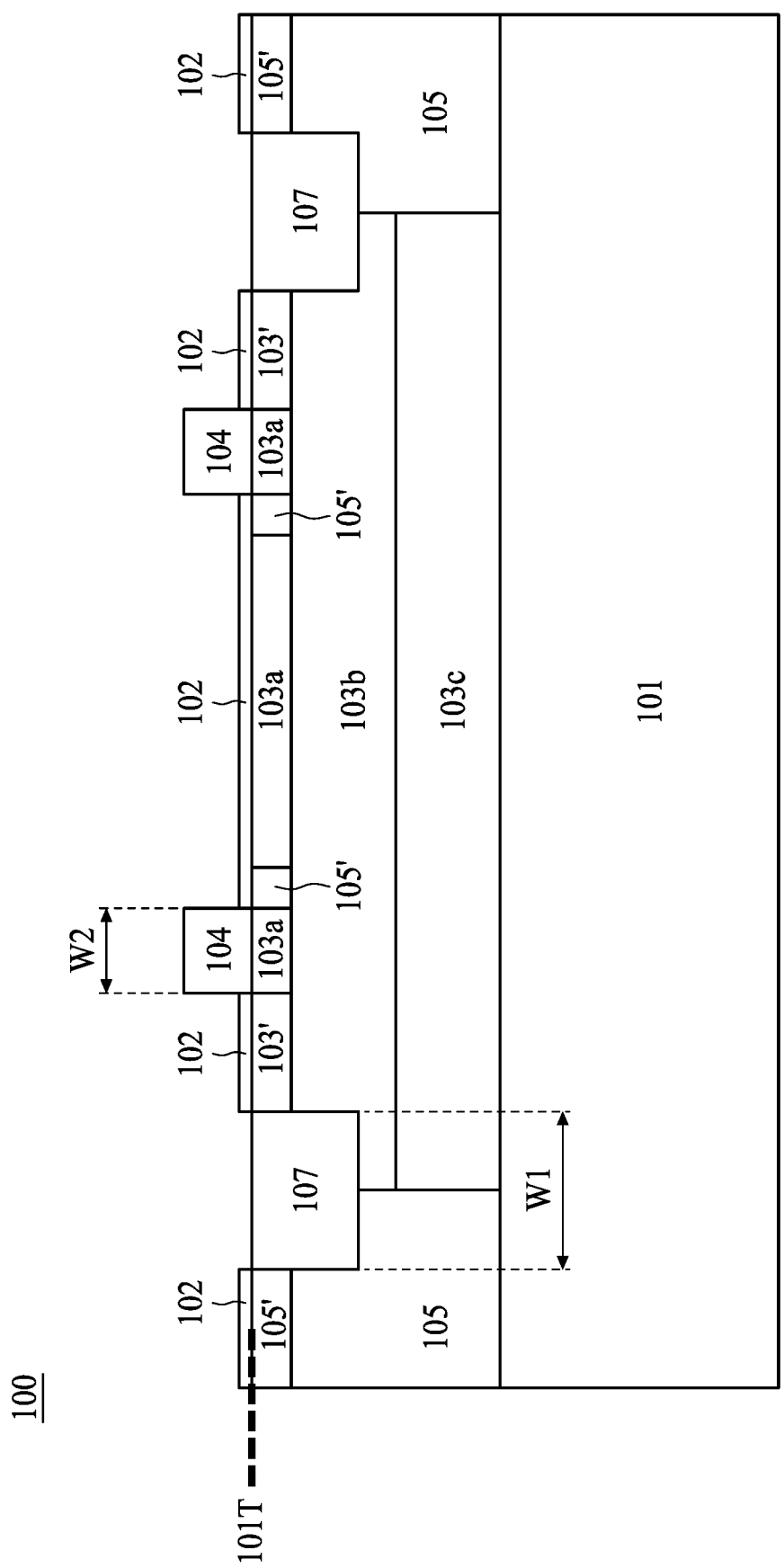
FIG. 1 is a cross sectional view of a semiconductor structure, according to some embodiments of present disclosure.

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure. Throughout the various views and illustrative embodiments, like reference numerals are used to designate like elements. Reference will now be made in detail to exemplary embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, an apparatus in accordance with the present disclosure. It is to be understood that elements not specifically shown or described may take various forms. Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration. Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Currently millimeter wave application deploying Schottky barrier diode (SBD) is generally accepted under a context of compound semiconductor, for example, GaAs, InP, or SiGe. Utilizing compound semiconductor incurs high cost and is hindered by various technology barriers. However, integration of SBD with silicon CMOS needs to be improved in order to better serve the development of high cutoff frequency devices highly demanded in millimeter wave application, or even 5G-related applications. By millimeter wave application referred herein, it is appreciated that the major frequency interacting with the corresponding millimeter wave device is greater than 300 GHz.

Generally speaking, the cutoff frequency of a device is inversely proportional to the junction capacitance and series resistance $R_s$. For example, the cutoff frequency for Si CMOS device ranges from 20 GHz to 100 GHz under technology node C013 to N28. In order to pump the frequency of Si CMOS device to be greater than 300 GHz (millimeter wave range), the junction capacitance $C_j$ and series resistance $R_s$ have to be reduced. In a conventional SBD in silicon CMOS, junction capacitance $C_j$ is determined by carrier concentration at the metal/semiconductor interface, whereas the series resistance $R_s$ is determined by the carrier concentration along conductive path as well as the length of the conductive path.

Carrier concentration appears to cause tradeoff between junction capacitance $C_j$ and series resistance $R_s$. For example, increasing carrier concentration apparently decreases the series resistance $R_s$ yet inevitably increases the junction capacitance $C_j$ due to generation of thinner depletion region at the anode. How to effectively decrease series resistance $R_s$ but not at the expense of deteriorating junction capacitance $C_j$ is the problem to be solved in manufacturing high cutoff frequency device in Si CMOS platform.

Present disclosure provides a semiconductor structure, particularly a SBD, which entails a retrograde implantation profile that allows series resistance $R_s$ and junction capacitance $C_j$ to be decrease at the same time.

Referring to FIG. 1, FIG. 1 is a cross sectional view of a semiconductor structure 100, according to some embodiments of present disclosure. The semiconductor structure 100 includes a substrate 101, a first well region, collectively, 103a, 103b, 103c, and a second well region 105 laterally surrounding the first well region 103a, 103b, 103c. An isolation region 107 is disposed in proximity to a top surface 101T of the semiconductor substrate 101 and is crossing over the boundaries of the first well region 103a, 103b, 103c and the second well region 105. In some embodiments, the first well region 103a, 103b, 103c is a first conductivity type, for example, n or p, the second well region 105 is a second conductivity type, for example, p or n, respectively, and the semiconductor substrate 101 is the second conductivity type, for example, p or n, respectively.

Compared to a device in non-SBD regions, the implant profile in the first well region 103a, 103b, 103c, of the SBD region, is somehow different. For example, the first well region in non-SBD regions may have a uniform implant profile constituted by at least three implantation operations with different implant energies. The first well region 103a, 103b, 103c, in the SBD region, however, has a non-uniform implant profile constituted by about 2 implantation operations with different implant energies. Details of the implant energies will be later described in FIG. 3 of current disclosure.

Still referring to FIG. 1, the implant profile in the first well region 103a, 103b, 103c shows a retrograde feature where a first lighter doped region 103a is disposed most in proximal to the top surface 101T, and a heavier doped region 103b is disposed under the first lighter doped region 103a. In some embodiments, the dopant concentration in the first lighter doped region 103a is less than $1E17/cm^3$, or particularly, the peak dopant concentration in the first lighter doped region 103a is less than $1E17/cm^3$. On the contrary, the dopant concentration in the heavier doped region 103b is greater than $1E17/cm^3$, or particularly, the lowest dopant concentration in the heavier doped region 103b is greater than $1E17/cm^3$.

In some embodiments, the semiconductor structure further includes a second lighter doped region 103c compared to the heavier doped region 103b. The second lighter doped region 103c is disposed under the heavier doped region 103b and is laterally surrounded by the second well region 105. In some embodiments, the dopant concentration of the second lighter doped region 103c is equal to or greater than that of the first lighter doped region 103a, and a bottom of the second lighter doped region 103c is substantially level with a bottom of the second well region 105.

Still referring to FIG. 1, a plurality of heavily doped regions of the first conductivity type 103' and a plurality of heavily doped regions of the second conductivity type 105' are disposed in proximal to the top surface 101T and in the first well region 103a, 103b, 103c. In some embodiments, the heavily doped region of the first conductivity type 103' and the heavily doped region of the second conductivity type 105' are located in the first lighter doped region 103a only. In other words, a bottom of the heavily doped region of the first conductivity type 103' or the heavily doped region of the second conductivity type 105' is higher than or about leveling with a top of the heavier doped region 103b. In addition, a plurality of heavily doped region of the second conductivity type 105' is disposed in proximal to the top surface 101T and in the second well region 105. As previously discussed, the first conductivity type can be n or p, and the second conductivity type can be p or n, respectively. In particular, the plurality of heavily doped regions of the first conductivity type 103' is aligned with the gate structure 104 at one side and aligned with the isolation region 107 at the opposite side.

Figure 2:
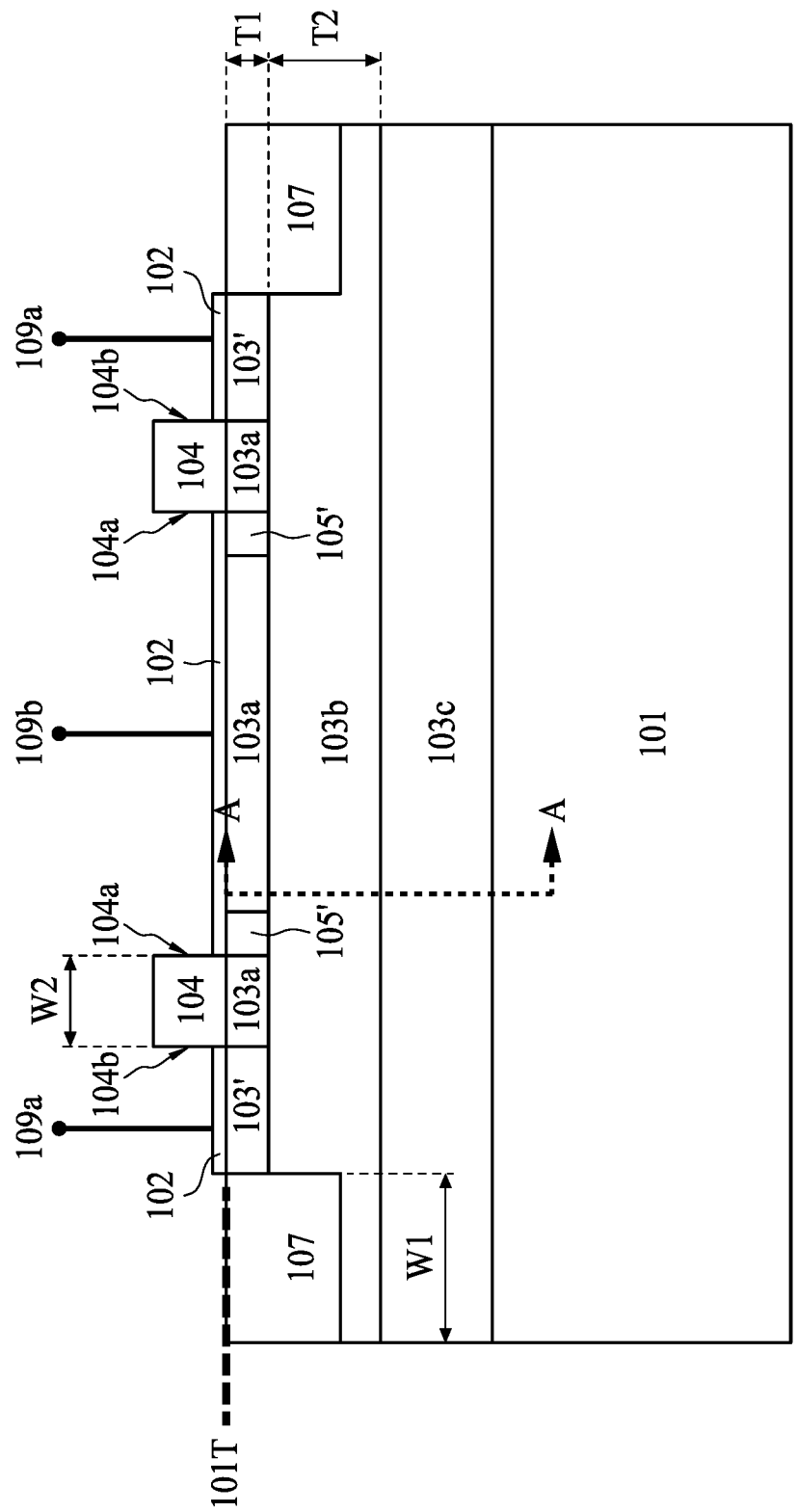
FIG. 2 is an enlarged cross sectional view of the semiconductor structure of FIG. 1.

Referring to FIG. 2, FIG. 2 is an enlarged cross sectional view of the semiconductor structure 100 of FIG. 1. A gate structure 104 disposed on the top surface 101T of the semiconductor substrate 101 has a first side 104a in proximal to an anode 109b and a second side 104b in proximal to a cathode 109a. In some embodiments, an SBD region defined by an isolation region 107 has more than one gate structure 104, therefore, an anode 109b is between adjacent gate structures 104 and a cathode 109a is between a gate structure 104 and an isolation region 107. A silicide layer 102 is disposed over the top surface 101T and cover the first well region 103a, 103b, 103c. Particularly, the silicide layer 102 and the first lighter doped region 103a form a Shottky barrier, whereas the silicide layer 102 and the heavily doped region of the first conductivity type 103' or the heavily doped region of the second conductivity type 105' form an Ohmic contact. When the SBD is under operation, the anode 109b is subject to a first voltage through metallic interconnect above the top surface 101T, and the cathode 109a is subject to a second voltage different from the first voltage.

A thickness T1 of the first lighter doped region 103a is greater than a depletion width under the anode 109b when subject to an operation bias. For example, when the SBD is operated under 1V, the thickness T1 can be in a range about 400 Angstrom to 600 Angstrom. When the SBD is operated under 2.5V, the thickness T1 can be in a range about 900 Angstrom to 1100 Angstrom. When the SBD is operated under 5V, the thickness T1 can be in a range about 1900 Angstrom to 2100 Angstrom. In some embodiments, the thickness T1 of the first lighter doped region 103a can be in a range of from about 500 Angstrom to about 1000 Angstrom. The first lighter doped region 103a is disposed in proximal to the top surface 101T in order to decrease the junction capacitance. It is understood that the smaller the depletion width, the greater the junction capacitance, and the depletion width under same voltage bias is determined by dopant concentration. Therefore, the present disclosure provides a low enough dopant concentration in proximal to the top surface 101T such that the depletion width will be wider and achieving a lower junction capacitance.

As shown in FIG. 2, a width of the isolation region W1 in some embodiments is substantially identical to a width of the gate structure W2. Compared with conventional SBD structure where a supplementary isolation region is placed in the substrate and between the heavily doped region of the first conductivity type 103' and the heavily doped region of the second conductivity type 105', the width W2 is greater than a width of said supplementary isolation region. In some embodiments, such supplementary isolation region is a shallow trench isolation (STI), similar to the isolation regions 107 but substantially narrower. In addition, the current path in the conventional SBD structure is longer due to the fact that current flows from anode to cathode through the contour of the supplementary isolation region. If a bottom of the supplementary isolation region is 5000 Angstrom under the top surface 101T, the current path is at least two times the 5000 Angstrom plus a width of the supplementary isolation region. The increase of the current path certainly increases the series resistance given the dopant concentration being uniform along the current path. Therefore, the present disclosure replaces the supplementary isolation region with a gate structure 104 such that the current path can be effectively reduced. In addition, a greater dopant concentration is created under the first lighter doped region 103a to form a heavier doped region 103b so as to further decrease the series resistance.

Figure 3:
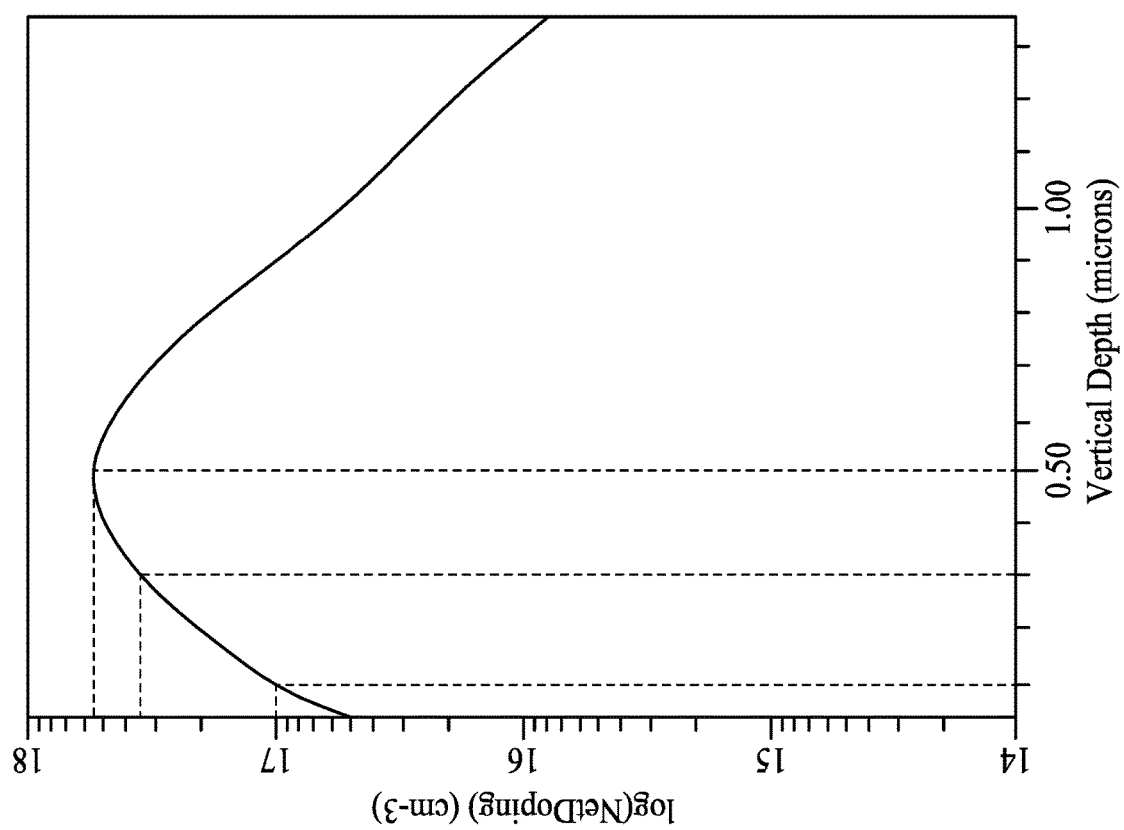
FIG. 3 is a diagram showing a retrograde implant profile, according to some embodiments of present disclosure.

Referring to FIG. 3, FIG. 3 is a diagram showing a retrograde implant profile, according to some embodiments of present disclosure. Horizontal axis of FIG. 3 is a vertical depth from the top surface 101T of the semiconductor substrate 101, and a vertical axis shows the dopant concentration to the respective vertical depth in logarithmic scale. FIG. 3 shows a dopant concentration profile along a vertical depth annotated by line AA in FIG. 2. As shown in FIG. 3, dopant concentration increases from the top surface 101T (vertical depth=0) to 0.1 microns under the top surface 101T (vertical depth=0.1). In some embodiments, vertical depth from 0 to 1000 Angstrom can be the first lighter doped region 103a having a peak concentration less than or equal to $1E17/cm^3$.

As shown in FIG. 3, dopant concentration further increases from 0.1 microns under the top surface 101T (vertical depth=0.1) to 0.5 microns under the top surface 101T (vertical depth=0.5). In some embodiments, region beyond dopant concentration of $1E17/cm^3$ is considered as a heavier doped region 103b. Peak concentration in the heavier doped region 103b can situate between 0.3 microns to 0.5 microns under the top surface 101T, depending on the implantation energies that dictates the implantation profile. As shown in FIG. 3, the peak concentration in the heavier doped region 103b situates at 0.5 micron with a dopant concentration of about $5E18/cm^3$. As discussed, several implantations can be conducted to form a desired implantation profile. In some embodiments, two implantations with rather close implantation energies, for example, 400 KeV and 350 KeV, are used to form the retrograde implantation profile as shown in FIG. 3.

Referring to FIG. 4, FIG. 4 is a cross sectional view of a semiconductor structure in a Schottky Barrier Diode (SBD) region during an intermediate stage of its manufacturing process, according to some embodiments of present disclosure. The second well region 105 with the second conductivity type is formed in proximity to the top surface 101T of the semiconductor substrate 101, further laterally surrounding an SBD region 103. The isolation region 107 having the width W1 is disposed in proximity to the top surface 101T of the semiconductor substrate 101 and crossing the boundary between the second well region 105 and the SBD region 103. The isolation region 107 can be formed by utilizing shallow trench isolation (STI) technology, local oxidation, photolithography process, deposition, or the like, but the present disclosure is not limited thereto.

Figures 5A, 5B:
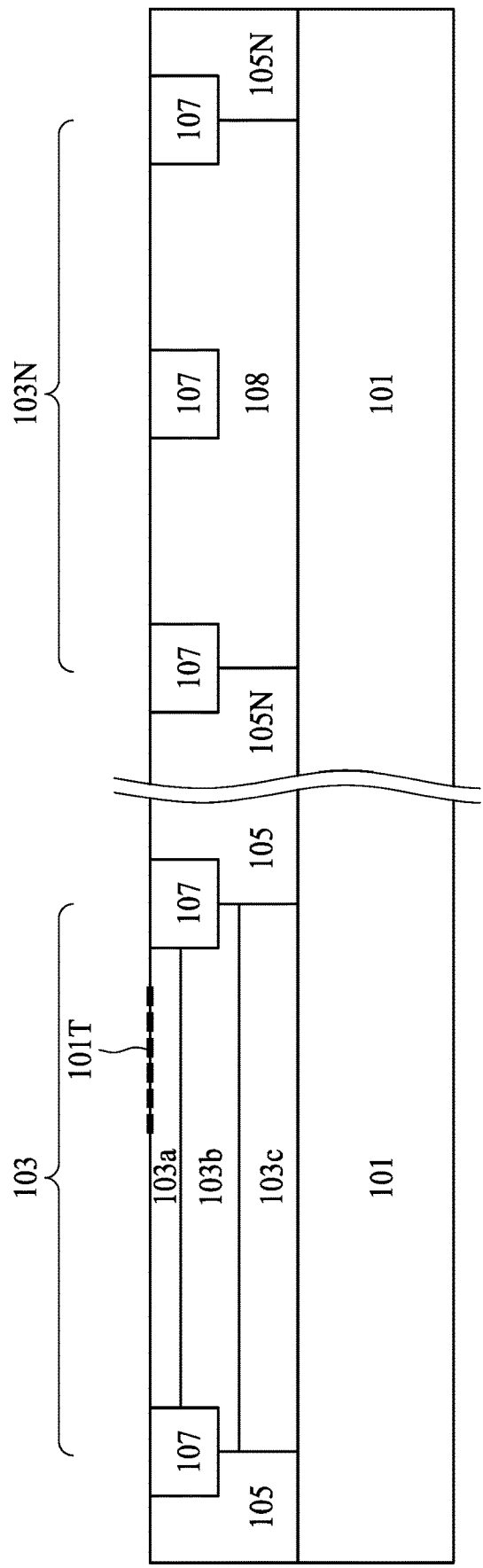
FIG. 5A is a cross sectional view of a semiconductor structure in an SBD region during an intermediate stage of its manufacturing process, according to some embodiments of present disclosure.
FIG. 5B is a cross sectional view of a semiconductor structure in a non-SBD region during an intermediate stage of its manufacturing process, according to some embodiments of present disclosure.

Referring to FIG. 5A and FIG. 5B, FIG. 5A is a cross sectional view of a semiconductor structure in an SBD region during an intermediate stage of its manufacturing process, and FIG. 5B is a cross sectional view of a semiconductor structure in a non-SBD region during an intermediate stage of its manufacturing process, according to some embodiments of present disclosure. The substrate 101 includes the SBD region 103 and a non-SBD region 103N. The SBD region 103 and the non-SBD region 103N may be separated by the isolation region 107, the second well region 105, and/or a third well region 105N having a second conductivity type, for example n or p, surrounding the non-SBD region 103N. In some embodiments, the SBD region 103 and the non-SBD region 103N occupies different areas in the semiconductor substrate 101 of a semiconductor die, in other words, the SBD region 103 may or may not be adjacent to the non-SBD region 103N. One or more isolation region 107 may be further formed within the non-SBD region 103N. The first well region 103a, 103b, 103c having the first conductivity type is formed in the SBD region 103 and surrounded by the second well region 105. The implant profile in the first well region 103a, 103b, 103c shows a retrograde feature, wherein the first lighter doped region 103a is disposed most in proximal to the top surface 101T, the heavier doped region 103b is disposed under the first lighter doped region 103a, and the second lighter doped region 103c is disposed under the heavier doped region 103b while laterally surrounded by the second well region 105. In some embodiments, the bottom of the second lighter doped region 103c is substantially level with the bottom of the second well region 105. As previously discussed in FIG. 3, the implant profile of the first well region 103a, 103b, 103c formed by controlling a dopant profile peak at about 0.3 microns to 0.5 microns under the top surface 101T, wherein a peak concentration in the heavier doped region 103b is greater than $1E17/cm^3$, whereas a peak dopant concentration in the lighter doped region 103a is less than $1E17/cm^3$. In some embodiments, the lighter doped region 103a is within 0.1 microns under the top surface 101T, the dopant concentration increases from 0.1 microns under the top surface 101T to 0.5 microns under the top surface 101T, and the peak concentration in the heavier doped region 103b is within 0.3 microns to 0.5 microns under the surface 101T.

In some embodiments, in order to increase the dopant concentration in the heavier doped region 103b, at least two implant operations are performed subsequent to forming a first mask (not shown in FIG. 5A and FIG. 5B) covering the non-SBD region 103N and exposing the SBD region 103 from the first mask. In some embodiments, two implantations may have rather close implantation energies, for example, 400 KeV and 350 KeV, in order to significantly increase the dopant concentration in the heavier doped region 103b and control the location of the peak concentration in the heavier doped region 103b, while avoiding significantly increase the dopant concentration in the first lighter doped region 103a and in the second lighter doped region 103c, further alleviating the increase on the junction capacitance $C_j$.

Subsequent to forming the first well region 103a, 103b, 103c and removing the first mask over the non-SBD region 103N, a second mask (not shown in FIG. 5A and FIG. 5B) is formed covering the SBD-region 103 and exposing the non-SBD region 103N. A fourth well region 108 having a first conductivity type is formed in the non-SBD region 103N. The first conductivity type may be different from the second conductivity type. In some embodiments, an implant profile of the fourth well region 108 is uniform, thus forming the fourth well region 108 may entail a plurality of implantation operations, for example, three implantation operations with different implantation energies, for example, 60 KeV, 200 KeV, and 350 KeV. The second mask is subsequently removed. The sequence of forming the SBD-region 103 and the non-SBD region 103N may be varied as long as complying with suitable procedures.

Should the retrograde implant profile is not implemented in the SBD region 103, the first well region 103a, 103b, 103c may demonstrate a substantially uniform well implantation profile such as that in the fourth well region 108 of the non-SBD region 103N. In this conventional case, the first mask and the second mask can be merged to become a single mask concurrently exposing the SBD region 103 and the non-SBD region 103N.

Figure 6:
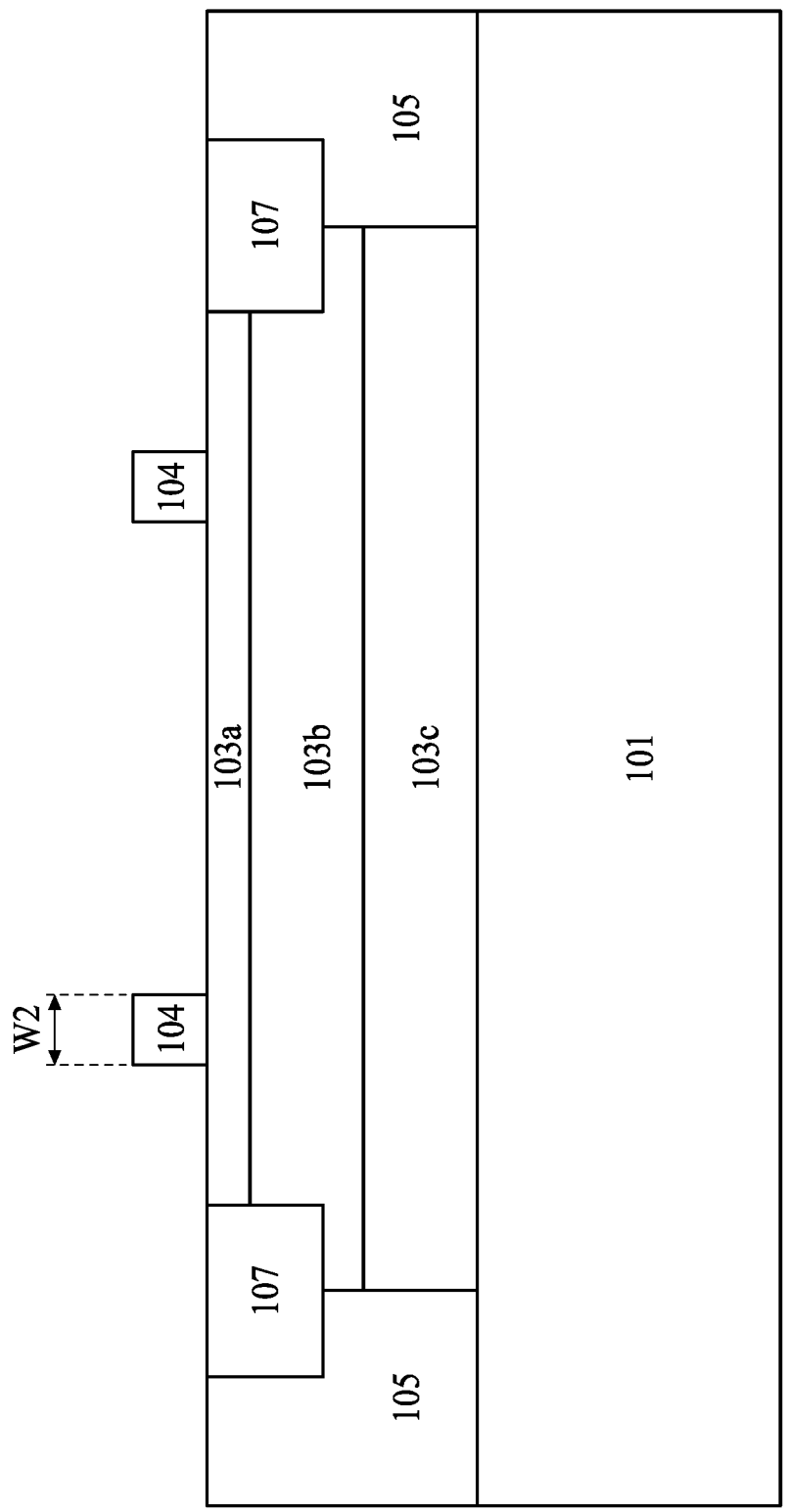
FIG. 6 is a cross sectional view of a semiconductor structure in an SBD region during an intermediate stage of its manufacturing process, according to some embodiments of present disclosure.

Referring to FIG. 6, FIG. 6 is a cross sectional view of a semiconductor structure in an SBD region during an intermediate stage of its manufacturing process, according to some embodiments of present disclosure. More than one gate structure 104 is formed within the SBD region 103, surrounded by the isolation regions 107 and above the top surface 101T in order to alleviate leakage current between the anode 109b and the cathode 109a (as shown in FIG. 9), as will be discussed in FIG. 8. In some embodiments, the gate structure 104 has the second width W2 substantially identical to the width W1 of the isolation regions 107. In some embodiments, the gate structure 104 may include polysilicon or metal. In some embodiments, the gate structure 104 is not connected to conductive plugs or interconnects that lead to a voltage bias. The gate structure 104 can be a dummy gate sharing the same material as those gates in the non-SBD region 103N.

Figure 7:
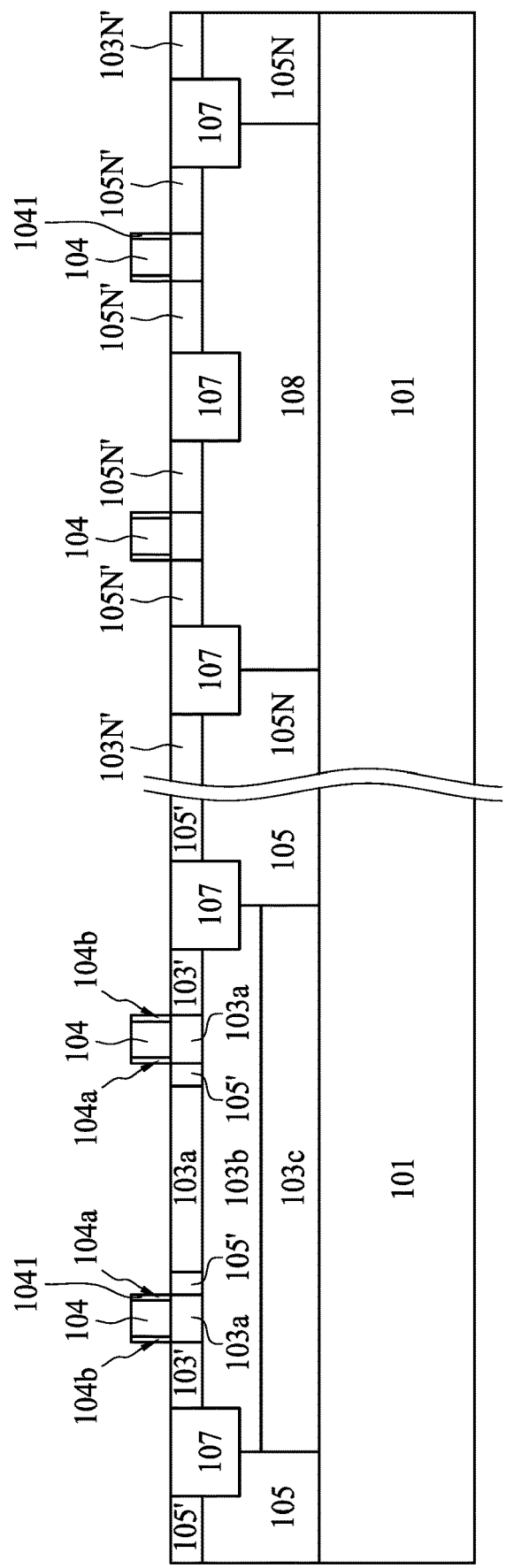
FIG. 7A is a cross sectional view of a semiconductor structure in an SBD region during an intermediate stage of its manufacturing process, according to some embodiments of present disclosure.
FIG. 7B is a cross sectional view of a semiconductor structure in a non-SBD region during an intermediate stage of its manufacturing process, according to some embodiments of present disclosure.

Referring to FIG. 7A and FIG. 7B, FIG. 7A is a cross sectional view of a semiconductor structure in an SBD region 103 during an intermediate stage of its manufacturing process, and FIG. 7B is a cross sectional view of a semiconductor structure in a non-SBD region 103N during an intermediate stage of its manufacturing process, according to some embodiments of present disclosure. In some embodiments, the non-SBD region 103N may include source 105N, drain 105N', gate 104, and the fourth well region 108. In some embodiments, a plurality of the gate structures 104 are formed in the non-SBD region 103N and above the fourth well region 108, wherein the gate structures 104 within the non-SBD region 103N may be separated by the isolation region 107 formed within the non-SBD region 103N. In order to alleviate hot carrier effect, lightly doped drain (LDD) implant operation including N-type LDD implant operation or P-type LDD implant operation can be performed at least in the non-SBD region 103N. The LDD implant operations in the SBD region 103 and the non-SBD region 103N may be performed concurrently, sequentially or separately by using the gate structure 104 as a hard mask.

The gate structures 104 within the SBD region 103 and the non-SBD region 103N may further include a plurality of spacers 1041 surrounding the sidewalls of the gate structures 104, wherein the spacers 1041 may be formed subsequent to the LDD implant operation. The spacers 1041 can be formed by a variety of techniques, for example, plasma-enhanced chemical vapor deposition (PECVD), chemical vapor deposition (CVD), physical vapor deposition (PVD), or the like. Similar to FIG. 2, herein the second side 104b of the gate structures 104 can also be defined as the side proximal to the isolation region 107 and the first side 104a is opposite to the second side 104b. The spacers 1041 may be used to define regions for the subsequently formed heavily doped region of the first conductivity type 103' and the heavily doped region of the second conductivity type 105' in the first lighter doped region 103a, therefore the plurality of heavily doped regions of the first conductivity type 103' can be aligned with the second side 104b at one side and aligned with the isolation region 107 at the opposite side; while the heavily doped region of the second conductivity type 105' can be aligned with the first side 104a at one side. As previously discussed in FIG. 1, the bottom of the heavily doped region of the first conductivity type 103' or the heavily and the bottom of the heavily doped region of the second conductivity type 105' are higher than or about leveling with the top of the heavier doped region 103b. In some embodiments, a plurality of heavily doped region of the second conductivity type 105' can be further disposed in proximal to the top surface 101T and in the second well region 105. The plurality of heavily doped region of the second conductivity type 105' is aligned with the isolation region 107 at a side above the second well region 105.

In some embodiments, the spacers 1041 may be used to define regions for a plurality of heavily doped region of the second conductivity type 105N' in the fourth well region 108, wherein the plurality of heavily doped region of the second conductivity type 105N' can be aligned with the gate structure 104 at one side and aligned with the isolation region 107 at the opposite side. In some embodiments, a plurality of a heavily doped region of the first conductivity type 103N' can be further disposed in proximal to the top surface 101T and in the third well region 105N. The plurality of heavily doped region of the first conductivity type 103N' is aligned with the isolation region 107 at a side above the third well region 105N.

Figure 8:
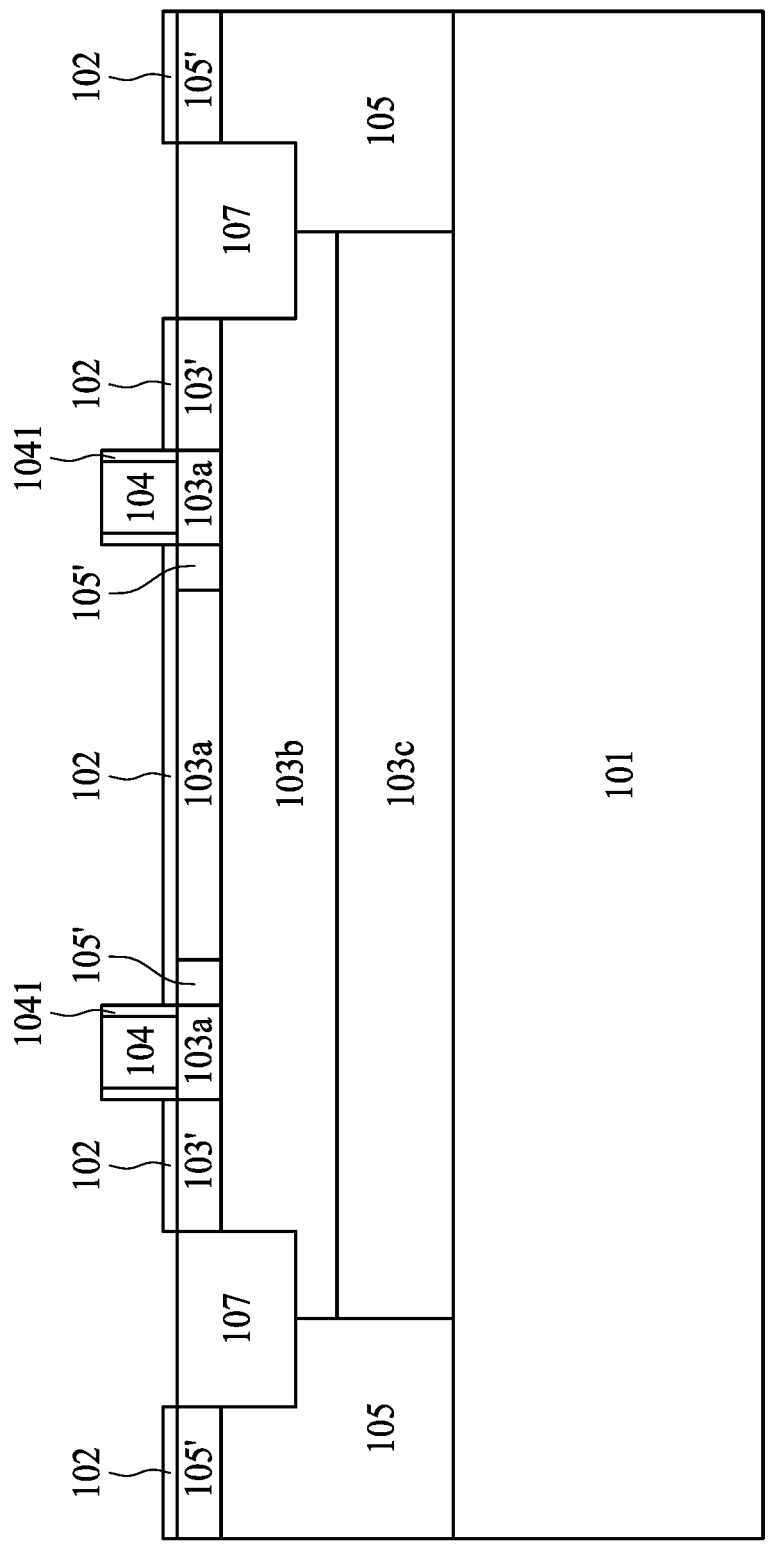
FIG. 8 is a cross sectional view of a semiconductor structure in an SBD region during an intermediate stage of its manufacturing process, according to some embodiments of present disclosure.
Figure 9:
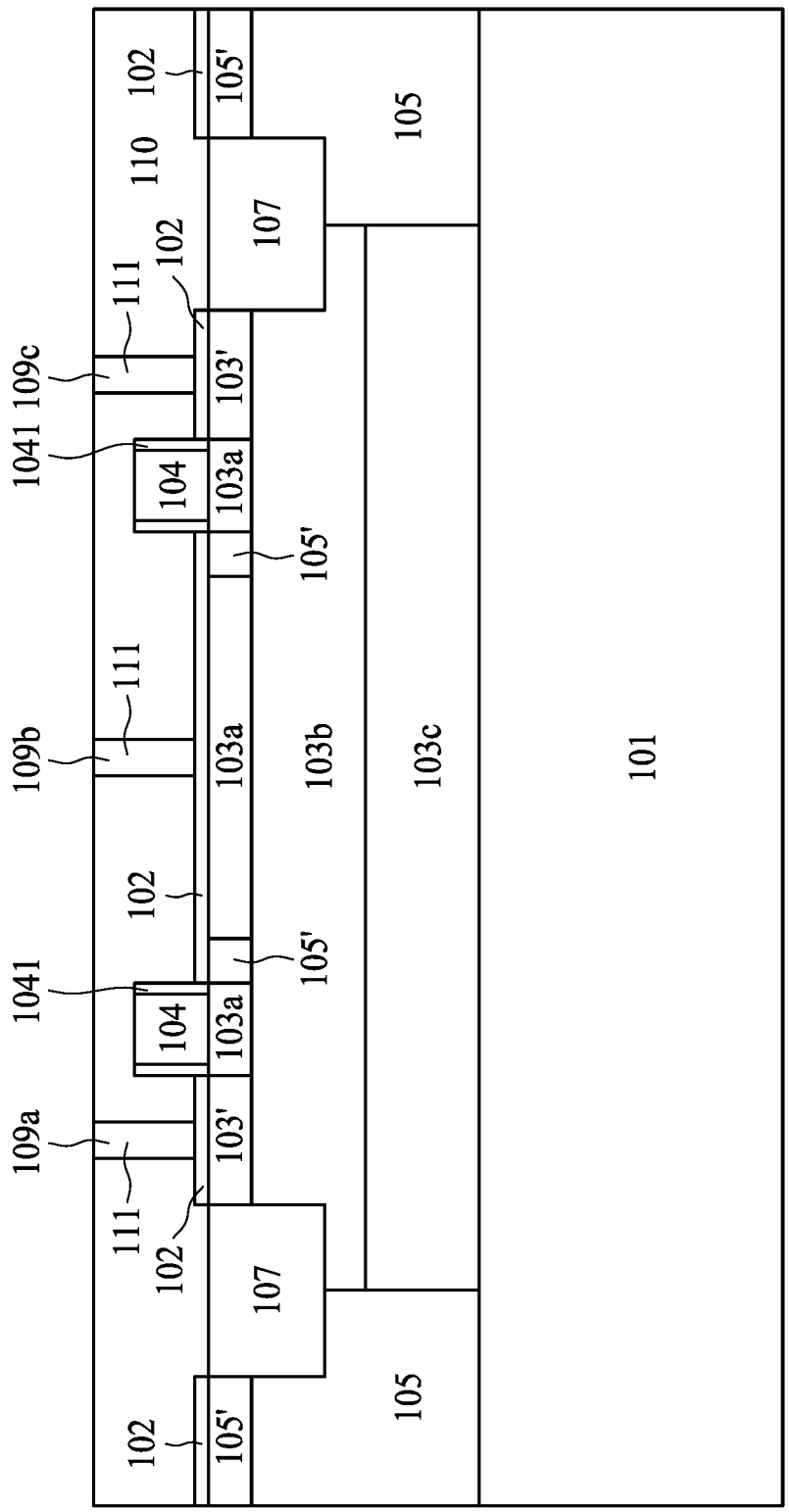
FIG. 9 is a cross sectional view of a semiconductor structure in an SBD region during an intermediate stage of its manufacturing process, according to some embodiments of present disclosure.

Referring to FIG. 8, FIG. 8 is a cross sectional view of a semiconductor structure in an SBD region during an intermediate stage of its manufacturing process, according to some embodiments of present disclosure. The silicide layer 102 is disposed over the top surface 101T of the SBD region 103 and covers the first lighter doped region 103a. Thus the silicide layer 102 and the first lighter doped region 103a form a Shottky barrier, whereas the silicide layer 102 and the heavily doped region of the first conductivity type 103' or the heavily doped region of the second conductivity type 105' form an Ohmic contact. In some embodiments, the gate structures 104 is surrounded by the silicide layer 102, wherein at least a portion of a sidewall on the first side 104a, at least a portion of a sidewall on the second side 104b, and a top surface of the gate structures 104 are exposed from the silicide layer 102. In some embodiments, a top surface of the isolation region 107 is exposed from the silicide layer 102.

Referring to FIG. 9, FIG. 9 is a cross sectional view of a semiconductor structure in an SBD region during an intermediate stage of its manufacturing process, according to some embodiments of present disclosure. An interlayer dielectric (ILD) 110 is formed over the silicide layer 102, the isolation region 107, and the gate structures 104. In some embodiments, the ILD 110 may include silicon oxide, silicon oxynitride, low-k dielectric material or other suitable materials. A planarization operation such as chemical mechanical planarization (CMP) operation may be performed to remove an excessively formed portion of the ILD 110 and planarize a top surface of the ILD 110. A plurality of contacts 111 may be formed in the ILD 110 and above the silicide layer 102 through suitable lithography and deposition operations, wherein the contact 111 formed between adjacent gate structures 104 can be wired as the cathode 109a, whereas the contact 111 formed between the gate structure 104 and the isolation region 107 can be wired as the anode 109b. In some embodiments, a plurality of contact openings (not shown in FIG. 9) may be formed in the ILD 110 prior to depositing conductive materials therein, wherein the contact openings may be formed by lithographic patterning, etching, the combination thereof, or other suitable operations. The cathode 109a and the anode 109b are separated by a width W2 of the gate structures 104, thus the leakage current induced between the cathodes 109a and the anodes 109b may be alleviated. To effectively reduce the aforesaid leakage current, the width W2 may be at least equal to or greater than the width W1 of the isolation region 107. In some embodiments, the anode 109b is subject to a first voltage through metallic interconnect above the top surface 101T, and the cathode 109a is subject to a second voltage different from the first voltage.

Figure 10:
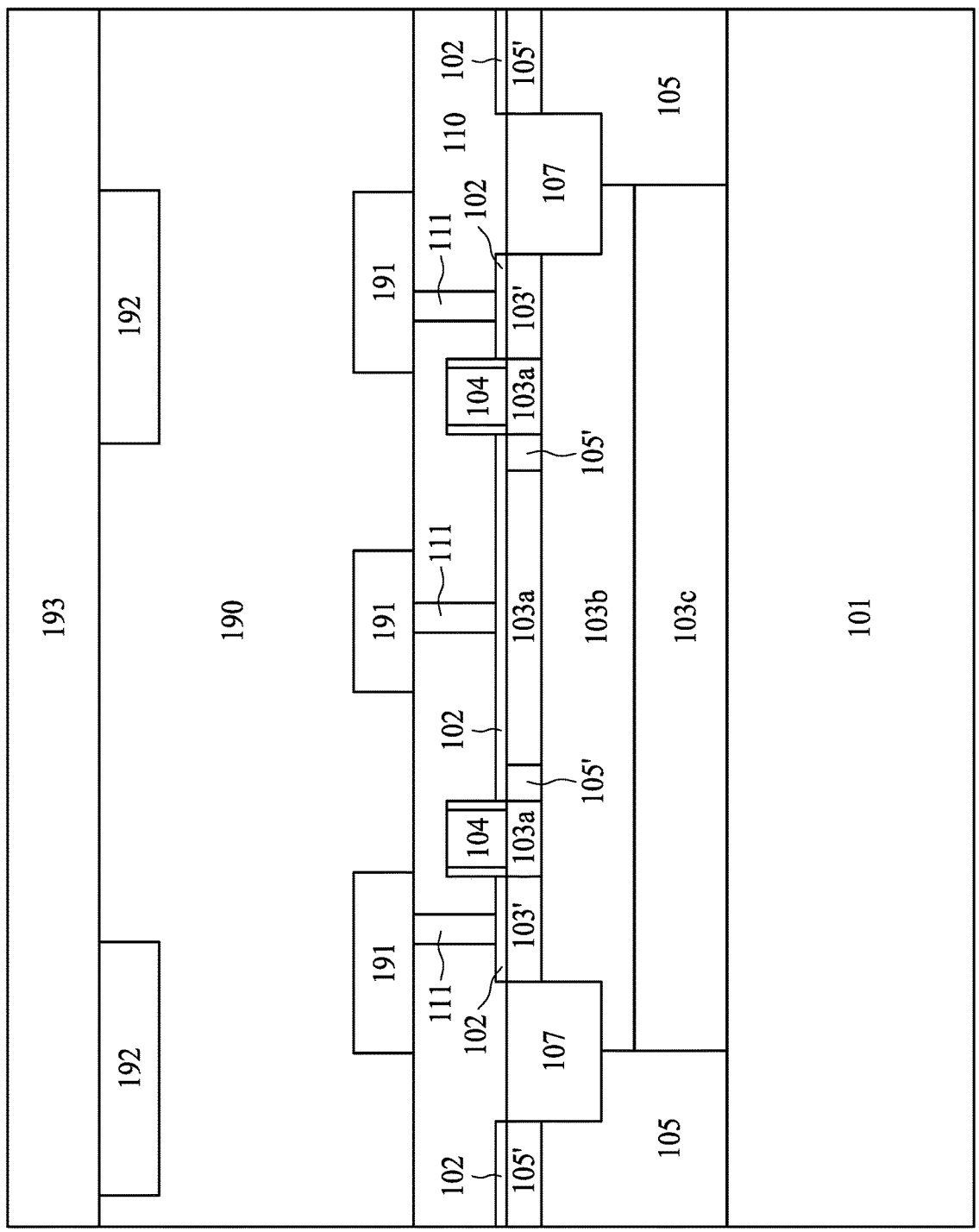
FIG. 10 is a cross sectional view of a semiconductor structure in an SBD region during an intermediate stage of its manufacturing process, according to some embodiments of present disclosure.

Referring to FIG. 10, FIG. 10 is a cross sectional view of a semiconductor structure in an SBD region during an intermediate stage of its manufacturing process, according to some embodiments of present disclosure. Various multilayers interconnect features can be formed after forming the plurality of contacts 111. For example, an $N^{th}$ metal line 191 is disposed above and electrically connected to the plurality of contacts 111, wherein N is a positive integer greater than 1. The $N^{th}$ metal line 191 is formed in an inter-metal dielectric (IMD) 190, wherein the IMD 190 may be formed of oxides such as un-doped Silicate Glass (USG), Fluorinated Silicate Glass (FSG), low-k dielectric materials, or the like. Some other interconnect features such as metal vias, vertical interconnects, horizontal interconnects may also be formed in the IMD 190. The IMD 190 may further include an $N+1^{th}$ metal line 192 on a side of the IMD 190 distal to the $N^{th}$ metal line 191, whereas the $N^{th}$ metal line 191 and the $N+1^{th}$ metal line 192 may be composed of substantially pure copper (for example, with a weight percentage of copper being greater than about 90 percent, or greater than about 95 percent) or copper alloys, and may be formed using the single and/or dual damascene processes. A passivation layer 193 may be further formed above the IMD 190.

Some embodiments provide a semiconductor structure, including a semiconductor substrate having a top surface, a first well region of a first conductivity type in the semiconductor substrate, a second well region of a second conductivity type in the semiconductor substrate, laterally surrounding the first well region, and an isolation region in the first well region and the second well region in proximity to the top surface. The first well region further includes a first lighter doped region in proximity to the top surface and a heavier doped region under the first lighter doped region.

Some embodiments provide schottky barrier diode, including a first well region of a first conductivity type in a semiconductor substrate, the first well region having a retrograde implant profile, a gate structure on a top surface of the semiconductor substrate and directly over the first well region, an anode at a first side of the gate structure, configured to couple to a first voltage, and a cathode at a second side of the gate structure, configured to couple to a second voltage different from the first voltage.

Some embodiments provide a method form forming a semiconductor structure, including forming an isolation structure of a first width in a semiconductor substrate, forming a retrograde implant profile in a first well region of a first conductivity type under a top surface of the semiconductor substrate, and forming a gate structure over the first well region and surrounded by the isolation structure.

Although the present invention and its advantages have been described in detail, it should be understood that various changes, substitutions and alterations can be made herein without departing from the spirit and scope of the invention as defined by the appended claims. For example, many of the processes discussed above cancan be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure, comprising:
   a semiconductor substrate having a top surface;
   a first well region of a first conductivity type in the semiconductor substrate, the first well region comprising:
      a first lighter doped region in proximity to the top surface;
      a heavier doped region under the first lighter doped region; and
      a second lighter doped region under the heavier doped region and continuously spaced away from the first lighter doped region by the heavier doped region;
   a second well region of a second conductivity type in the semiconductor substrate, laterally surrounding the first well region; and
   an isolation region in the first well region and the second well region in proximity to the top surface.

2. The semiconductor structure of claim 1, the first lighter doped region comprises a thickness from about 500 Angstrom to about 1000 Angstrom.

3. The semiconductor structure of claim 1, further comprising a gate structure on the top surface and directly over the first well region.

4. The semiconductor structure of claim 3, further comprising a silicide layer over the top surface and surrounding the gate structure.

5. The semiconductor structure of claim 3, wherein a width of the isolation region and a width of the gate structure is substantially identical.

6. The semiconductor structure of claim 1, wherein the first lighter doped region comprises a peak dopant concentration less than $1E17/cm^3$.

7. The semiconductor structure of claim 1, further comprising a first region of the first conductivity type and a second conductive region of the second conductivity type in the first well region.

8. The semiconductor structure of claim 1, wherein a bottom surface of the second lighter doped region is leveled with a bottom surface of the second well region.

9. A schottky barrier diode, comprising:
   a first well region of a first conductivity type in a semiconductor substrate, the first well region comprising a retrograde implant profile, wherein the retrograde implant profile comprises:
      a first doped region in proximity to the top surface;

a second doped region under the first dopant region; and a third doped region under the second doped region and continuously spaced away from the first doped region, wherein a peak dopant concentration in the first well region is within the second doped region;

a gate structure on a top surface of the semiconductor substrate and directly over the first well region;

an anode at a first side of the gate structure, configured to couple to a first voltage; and a cathode at a second side of the gate structure, configured to couple to a second voltage different from the first voltage.

10. The schottky barrier diode of claim 9,
wherein the first doped region comprises a maximum dopant concentration less than $1E17/cm^3$, and the second doped region comprises a minimum dopant concentration greater than $1E17/cm^3$.

11. The schottky barrier diode of claim 9, wherein the first doped region comprises a thickness from about 500 Angstrom to about 1000 Angstrom.

12. The schottky barrier diode of claim 9, wherein a peak dopant concentration in the second doped region is about 3000 Angstrom to 5000 Angstrom under the top surface.

13. The schottky barrier diode of claim 9, further comprising a second well region of a second conductivity type in the semiconductor substrate, laterally surrounding the first well region.

14. The schottky barrier diode of claim 13, further comprising an isolation region in the semiconductor substrate and across the first doped region and the second doped region, a width of the isolation region is substantially identical to a width of the gate structure.

15. The schottky barrier diode of claim 13, further comprising:
a first conductive region of the first conductivity type under the cathode; and
a second conductive region of the second conductivity type under the anode.

16. The schottky barrier diode of claim 15, wherein the first conductive region and the second conductive region are in the first doped region.

17. The schottky barrier diode of claim 9, wherein the anode and the cathode comprises metal silicides.

18. A method for forming a semiconductor structure, comprising:
forming an isolation structure of a first width in a semiconductor substrate;
forming a retrograde implant profile in a first well region of a first conductivity type under a top surface of the semiconductor substrate;
forming a gate structure over the first well region and surrounded by the isolation structure;
forming a first conductive region of the first conductivity type and a second conductive region of a second conductivity type in the first well region.

19. The method of claim 18, wherein forming the retrograde implant profile comprises forming a dopant profile peak at about 3000 Angstrom to 5000 Angstrom under the top surface.

20. The method of claim 18, wherein forming the retrograde implant profile comprises controlling a dopant concentration within 1000 Angstrom under the top surface to be less than $1E17/cm^3$.

* * * * *